US008952508B2

(12) United States Patent
Miyake

(10) Patent No.: US 8,952,508 B2
(45) Date of Patent: Feb. 10, 2015

(54) LEAD FRAME, SEMICONDUCTOR MANUFACTURING APPARATUS, AND SEMICONDUCTOR DEVICE

(75) Inventor: Eitaro Miyake, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/605,687

(22) Filed: Sep. 6, 2012

(65) Prior Publication Data

US 2013/0119526 A1     May 16, 2013

(30) Foreign Application Priority Data

Sep. 21, 2011    (JP) ................................ P2011-205444

(51) Int. Cl.
*H05K 1/11*          (2006.01)
*H01L 21/56*        (2006.01)
*H01L 23/495*      (2006.01)
*H01L 23/00*        (2006.01)

(52) U.S. Cl.
CPC .............. *H05K 1/111* (2013.01); *H01L 21/56* (2013.01); *H01L 23/49503* (2013.01); *H01L 24/78* (2013.01); *H01L 23/49541* (2013.01); *H01L 23/49544* (2013.01); *H01L 23/49551* (2013.01); *H01L 24/97* (2013.01); *H01L 2224/78301* (2013.01); *H01L 21/565* (2013.01); *H01L 2224/45124* (2013.01); *H01L 2924/00014* (2013.01); *H01L 2224/48247* (2013.01)
USPC ......... 257/676; 257/670; 257/675; 174/126.1

(58) Field of Classification Search
CPC . H01L 23/49568; H01L 23/495; H01L 21/56; H01L 23/49503; H05K 1/111
USPC .......................... 174/126.1; 257/670, 675, 676
See application file for complete search history.

(56) References Cited

U.S. PATENT DOCUMENTS

| | | | | |
|---|---|---|---|---|
| 5,291,059 | A * | 3/1994 | Ishitsuka et al. | 257/666 |
| 5,900,582 | A * | 5/1999 | Tomita et al. | 174/529 |
| 8,072,051 | B2 * | 12/2011 | Galera et al. | 257/666 |
| 8,188,579 | B1 * | 5/2012 | Kim et al. | 257/666 |

FOREIGN PATENT DOCUMENTS

| | | |
|---|---|---|
| JP | 04249355 A | 9/1992 |
| JP | 11097608 A | 4/1999 |
| JP | 2002170917 A | 6/2002 |
| JP | 2006-191144 A | 7/2006 |

OTHER PUBLICATIONS

Japanese Office Action dated Jan. 28, 2014, filed in Japanese counterpart Application No. 2011-205444, 6 pages.

\* cited by examiner

*Primary Examiner* — Peniel M Gumedzoe
(74) *Attorney, Agent, or Firm* — Patterson & Sheridan LLP

(57) ABSTRACT

According to one embodiment, a lead frame includes a die pad having a mounting surface on which a semiconductor chip is mounted, plural leads having inner leads and outer leads, and a connecting member that extends from the die pad to both ends of a plurality of leads and connects the die pad and the plurality leads so that the ends of the inner leads are positioned above of the mounting surface.

18 Claims, 6 Drawing Sheets

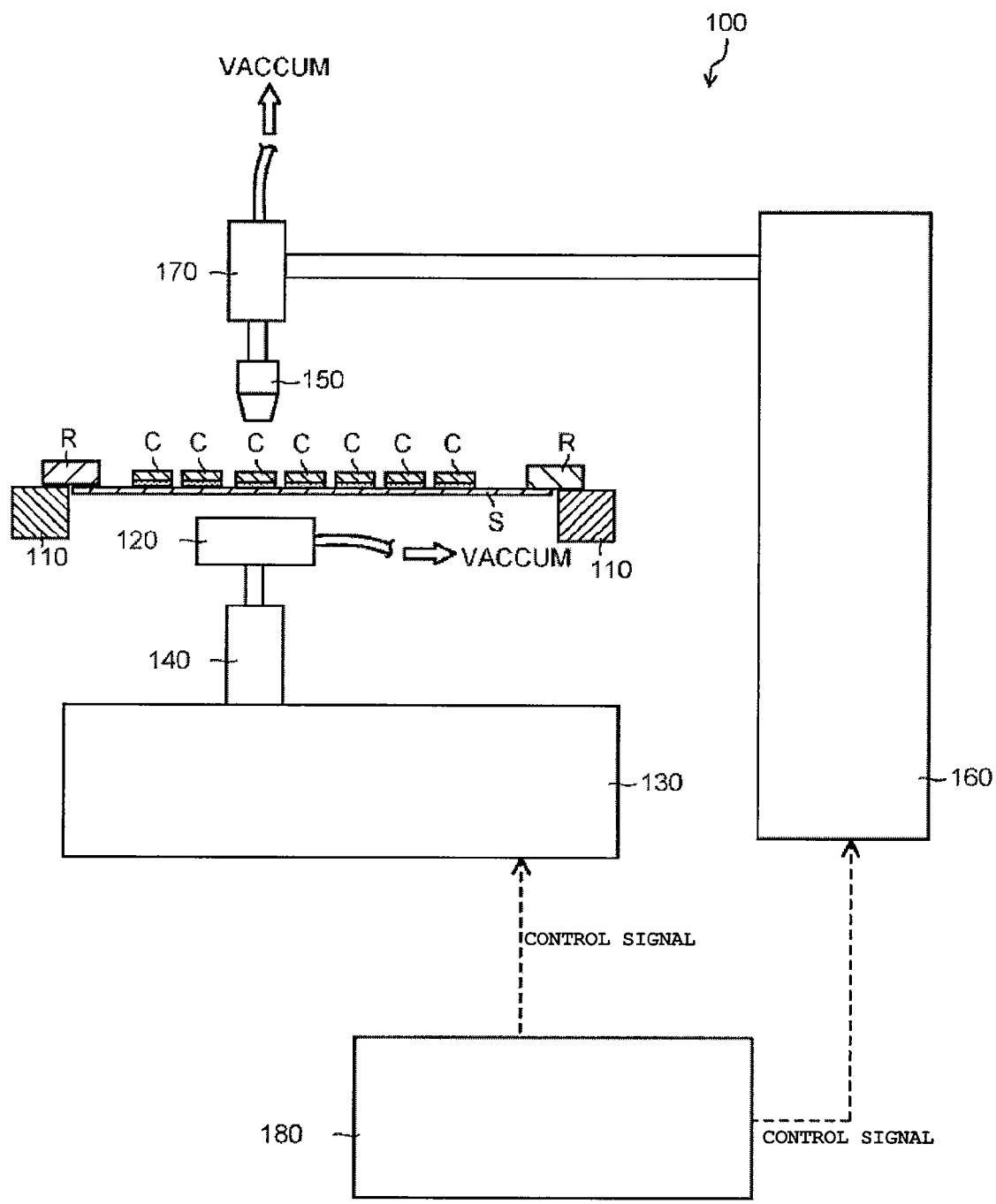

LEAD FRAME, SEMICONDUCTOR MANUFACTURING APPARATUS, AND SEMICONDUCTOR DEVICE

CROSS-REFERENCE TO RELATED APPLICATION

This application is based upon and claims the benefit of priority from Japanese Patent Application No. 2011-205444, filed Sep. 21, 2011, the entire contents of which are incorporated herein by reference.

FIELD

Embodiments described herein relate generally to a lead frame, which is used in packaging a semiconductor chip, a semiconductor manufacturing apparatus using the lead frame, and a semiconductor device.

BACKGROUND

A conventional lead frame is configured by connecting a frame made of a thick plate having a die pad formed thereon by a punching operation, to a frame of a thin plate having a plurality lead terminals formed thereon. The lead frames of thick plate and thin plate are connected by inserting and caulking a pin extending from one of the frames into a through hole installed in the other of the frames.

DESCRIPTION OF THE DRAWINGS

FIG. 3 is a constitutional diagram showing a die bonding machine.

DETAILED DESCRIPTION

Figure 1:
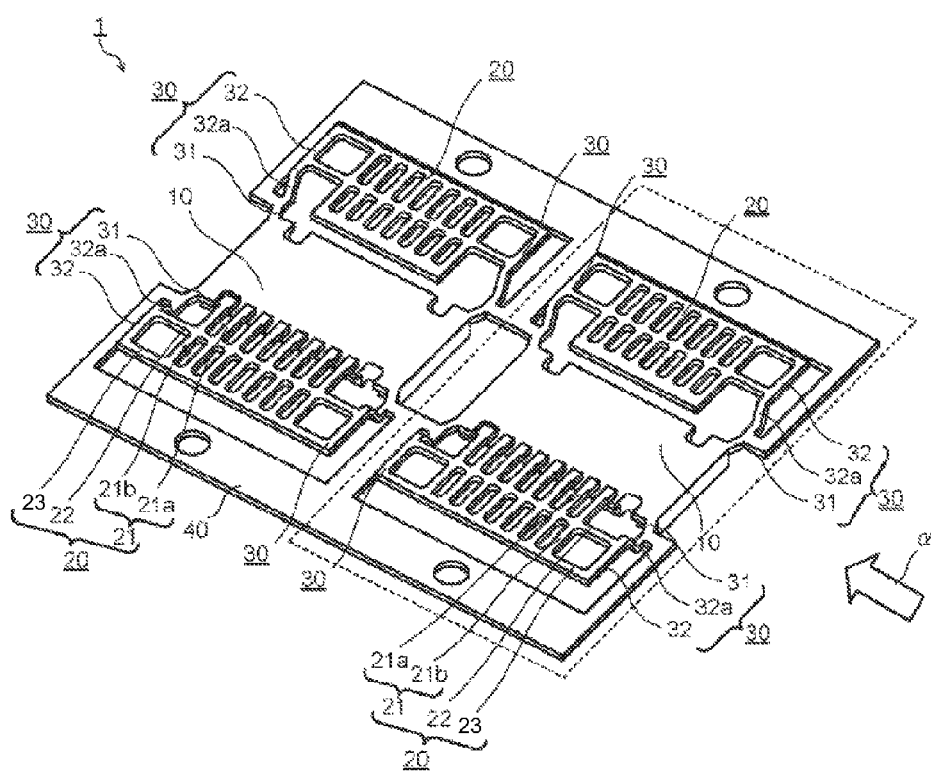
FIG. 1 is a constitutional diagram showing a lead frame of an embodiment.

In one embodiment, a lead frame 1 is configured by stamping, punching or otherwise patterning a strip of material from which the lead frame is to be formed to provide a die pad 10, one or more lead groups 20 disposed on either side of the die pad 10, a frame body 40 at least partially surrounding the one or more lead groups 20, and a connecting member 30 configured of narrow webs of the underlying strip of material which interconnect the die pad 10, the one or more lead groups 20, and the frame body 40 such that these elements are formed from a single piece of material, without separation thereof into individual components. The connecting member 30 provides support to space the one or more lead groups 20 from the die pad 10 and/or the frame body 40.

In the embodiment of FIG. 1, the die pad 10 and frame body 40 are formed at a first level (e.g., on a first plane), the lead groups 20 are formed above the level of the die pad 10 and frame body 40, and the connecting member 30 includes a first web 32a of the underlying strip of material, which supports the lead groups 20 in a position to the side of and above the die pad 10, and second web 31 of the underlying material which interconnects and supports the die pad 10 between opposed lead groups 20 disposed on the frame body 40. The first web 32a and second web 31 can also be described as a first narrow web and a second narrow web due to having a narrow shape in some embodiments.

Figure 2A:
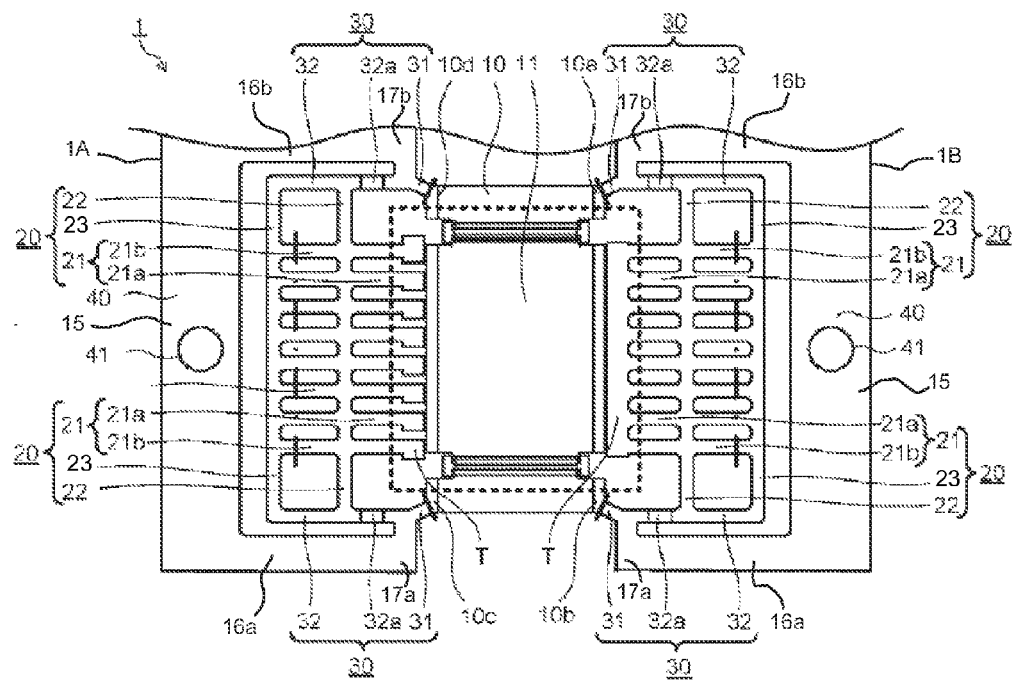
FIGS. 2A and 2B are a partial plan view and a side view showing the lead frame of an embodiment.

Referring to FIG. 2a, a single lead frame 1 is configured from a unitary strip (e.g., one piece) of material including a first frame body element 1A and a second frame body element 1B (also referred to as U-shaped members members) oriented generally opposing the first frame body element 1A. The first and second opposing frame lead body elements 1A and 1B are each formed generally in the shape of a "U," wherein the open sides (i.e., arms 16a, 16b) of the U-shape of each frame body element 1A and 1B face each other with a spacing there between. For example, the arms 16a, 16b of the U-shaped members open inwardly towards each other. Moreover, the base 15 of the U-shaped members (i.e., frame body elements 1A, 1B) connects said arms 16a, 16b. The die pad 10 is disposed between the two opposed frame body elements 1A, 1B, and is connected to the opposed ends 17a 17b of each of the frame body elements 1A, 1B through the second web 31 extending from a region adjacent to the ends (e.g., 17a, 17b) of each of the arms 16a, 16b of the frame body elements 1A, 1B.

According to an embodiment, the lead groups 20 include a preform lead portion 23. The preform lead portion 23 includes a tie bar 22 which extends substantially across the lead group 20 in a direction spanning the opposing opposed the side arms 16a, 16b of the U-shaped members (i.e., frame body elements 1A, 1B). The preform lead portion 23 of the lead group 20 provides structural stability of the individual leads in the lead group 20 prior to the attachment of wires between a semiconductor die placed on the die pad 10 and individual leads in the lead group 20.

Additionally, the lead groups 20 are disposed over and supported above the open U-shaped-members (i.e., frame body elements 1A, 1B) by a first web 32a which extends from the level of each arm 16a 16b of the U-shaped members (i.e., frame body elements 1A and 1B) to the level of the lead groups 20 supported thereby. In the embodiment shown in FIGS. 1, 2a, and 2b, the level of the lead groups 20 is shown as above the level of the frame body elements 1A and 1B, however, according to aspects, the lead groups 20 can be at the same level as the frame bodies body elements 1A and 1B or disposed below the level of the frame body elements 1A and 1B.

According to an embodiment, a lead frame is provided in which the precision for mounting a semiconductor chip can be improved by enabling a single piece of material to form the lead frame elements, die pad and lead groups of the lead frame, Using a single piece of material eliminates tolerances added to the design by the need to align a pin and hole as in prior lead frames In general, according to one embodiment, a lead frame 1 is provided with a die pad 10 having a mounting surface 11 on which a semiconductor chip is mounted, a plurality of leads having inner leads 21a and outer leads 21b, and a connecting member 30 that extends from the die pad 10 to both ends of the plurality of leads and connects the die pad 10 and the plurality of leads so that the ends of the inner leads 21a are positioned above the mounting surface 11.

Figure 2B:
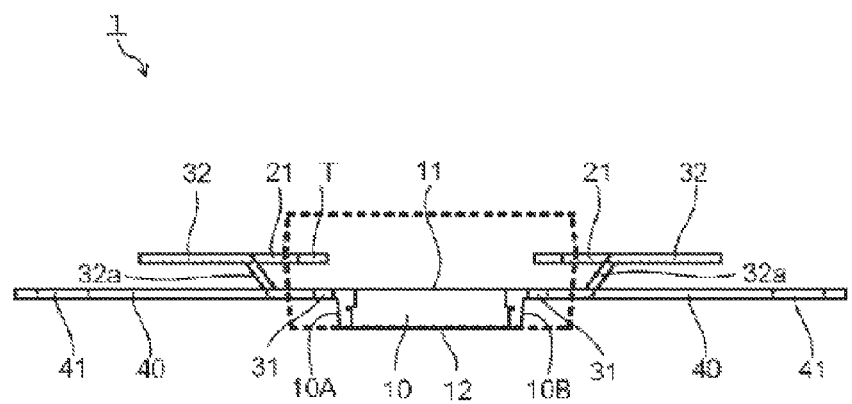

FIG. 1 is a perspective view of a lead frame 1. FIG. 2A is a plan view of an area enclosed within the dashed line region of the lead frame 1. FIG. 2B is a side view showing the lead frame 1 in an arrow a direction of FIG. 1. The dashed line in FIGS. 2A and 2B, indicates the boundary of a resin encapsulant which will be molded over portions of the lead frame after the attachment and wire bonding of a die or chip thereto. In addition, the dashed line and the bold solid line indicate the cutting positions of the lead frame 1 after packaging with the mold resin. Next, the lead frame 1 of an embodiment will be explained with reference to FIGS. 1, 2A, and 2B.

The lead frame 1 is configured by stamping or otherwise patterning a unitary strip or plate of material to form all of the elements of the lead frame 1 shown in FIGS. 1, 2A and 2B. The lead frame 1 includes a pair of frame body elements 1A, 1B, each arranged in a U-shape and arranged opposite each other, a die pad 10 formed in the frame body 40 and disposed between and integrally formed of the same initial plate like material as the frame bodies body elements, two lead groups 20 likewise integrally formed of the same initial plate like material as die pad 10 and the frame body elements 1A, 1B, and a connecting member 30, likewise integrally formed of the same initial plate like material and connecting the die pad 10 and the lead group 20 to the frame body 40. According to aspects of the present disclosure, about 10 elements (e.g., semiconductor chips) may be connected as a single unit.

The die pad 10 has a mounting surface 11 on which a semiconductor chip (not shown in FIGS. 2A and 2B) is mounted. The die pad 10 also serves as a radiating plate. A back face 12 of the die pad 10 is sealed with a mold resin when the back face 12 is exposed from the package surface. At opposed ends 10A, 10B of the die pad 10, walls formed as standoffs 10A, 10B extend generally orthogonal to the die receiving surface of the die pad 10 in a direction opposite to the raised position of the lead groups 20 from the die pad 10. The standoffs 10A, 10B may be used to support the underside of the die pad 10 during the resin molding step discussed later herein, and also as heat conducting pathways to conduct heat generated, during use or operation of the chip, from the die pad 10.

The lead groups 20 are arranged at an end surface (side surface) extending between the opposed standoffs 10A and 10B on each side of die pad. The lead group 20 includes a plurality of leads 21 and tie bars 22. The tie bars 22 extend in a direction generally perpendicular to the longitudinal direction of plurality of leads 21 and generally parallel to the sides of the die pad 10 and connect and position the plurality of leads 21. Each lead 21 has an inner lead 21a, which is connected at an end thereof with a corresponding bond pad of the semiconductor chip by a bonding wire B, and an outer lead 21b which includes an external connecting terminal. Note that in one of the lead group 20 to the right of the FIG. 2A, the inner leads 21a are still connected as a single extending bar like member, which will be later defined into individual inner leads by cutting slots through the portions of the bar like material intermediate of the ends of each of the inner leads 21a. Likewise, in the lead group to the left of FIG. 1, the outer leads 21b are joined as a single bar like member, which is likewise later cut into intermediate individual leads. The tie bars 22 and the bar like members are cut after the semiconductor chip is sealed with a mold resin.

The connecting member 30 is formed of narrow webs of the underlying lead frame material which extends from the die pad 10 and which also connects the die pad 10 and the lead groups 20 to the frame body 40. The connecting member 30 includes a first web 32a and a second web 31. The second web 31 connects the standoff of the four corners 10a to 10d of the die pad 10 to the frame body 40, and a cantilever portion 32 connects the lead group 20 to the frame body 40. The cantilever portion 32 includes the first web 32a of the underlying strip of material. The cantilever portion 32 extends parallel with the longitudinal direction of the leads 21 of the lead group 20 and the first narrow web 32a is used for positioning the ends T of the inner leads 21a of the lead group 20 above the mounting surface 11 of the die pad 10 between standoffs 10A and 10B. The die pad 10 and the lead groups 20 are held at designated positions with respect to the frame body 40 by the connecting member 30.

The frame body 40 is formed from the same unitary strip or plate of material, and an alignment (positioning) hole 41 is provided therethrough for positioning the die pad 10 and the lead group 20 with respect to semiconductor manufacturing apparatuses such as a die bonding machine, a bonding machine, and a resin molding machine, which will be explained in more detail herein. The holes 41 of the frame body 40 are inserted by the alignment (positioning) pin provided in the above-mentioned semiconductor manufacturing apparatuses. For example, the alignment pin is used to position the die pad 10 and the lead group 20 of the lead frame 1 with respect to these semiconductor manufacturing apparatuses.

Next, the semiconductor manufacturing apparatuses for manufacturing a semiconductor package by using the lead frame 1, specifically using a die bonding machine, a wire bonding machine, and a resin molding machine, will be explained.

(Die Bonding Machine 100)

FIG. 3 is a constitutional diagram showing a die bonding machine 100. The die bonding machine 100 includes fixing jigs 110, thrust-up mechanism 120, X-Y stage 130, cylinder 140, collet 150, driving mechanism 160, cylinder 170, and control mechanism 180. The die bonding machine 100 places semiconductor chips C on the die pad 10 of the lead frame 1 (see FIGS. 1, 2A, and 2B). A vacuum pump not shown in the figure is connected to the thrust-up mechanism 120 and the collet 150.

The fixing jigs 110 hold metal frames R for gripping the outer, peripheral parts of an adhesive sheet S to which many semiconductor chips C cut out by a dicing process are adhered. The thrust-up mechanism 120 pushed upwardly each cut semiconductor chip C from the back face (lower side). The X-Y stage 130 drives the thrust-up mechanism 120 in a direction horizontal to the semiconductor chips C on the adhesive sheet S. The X-Y stage 130 performs a positioning operation in the horizontal direction. The cylinder 140 drives the thrust-up mechanism 120 in a direction perpendicular to the semiconductor chips C on the adhesive sheet S.

The collet 150 vacuum chucks the semiconductor chips C which are thrust up by the thrust-up mechanism 120. The driving mechanism 160 drives the collet 150 in a direction horizontal to the semiconductor chips C on the adhesive sheet S. The cylinder 170 drives the collet 150 in a direction perpendicular to the semiconductor chips C on the adhesive sheet S. A control mechanism 180 controls the entire die bonding machine 100.

(Wire Bonding Machine 200)

Figure 4:
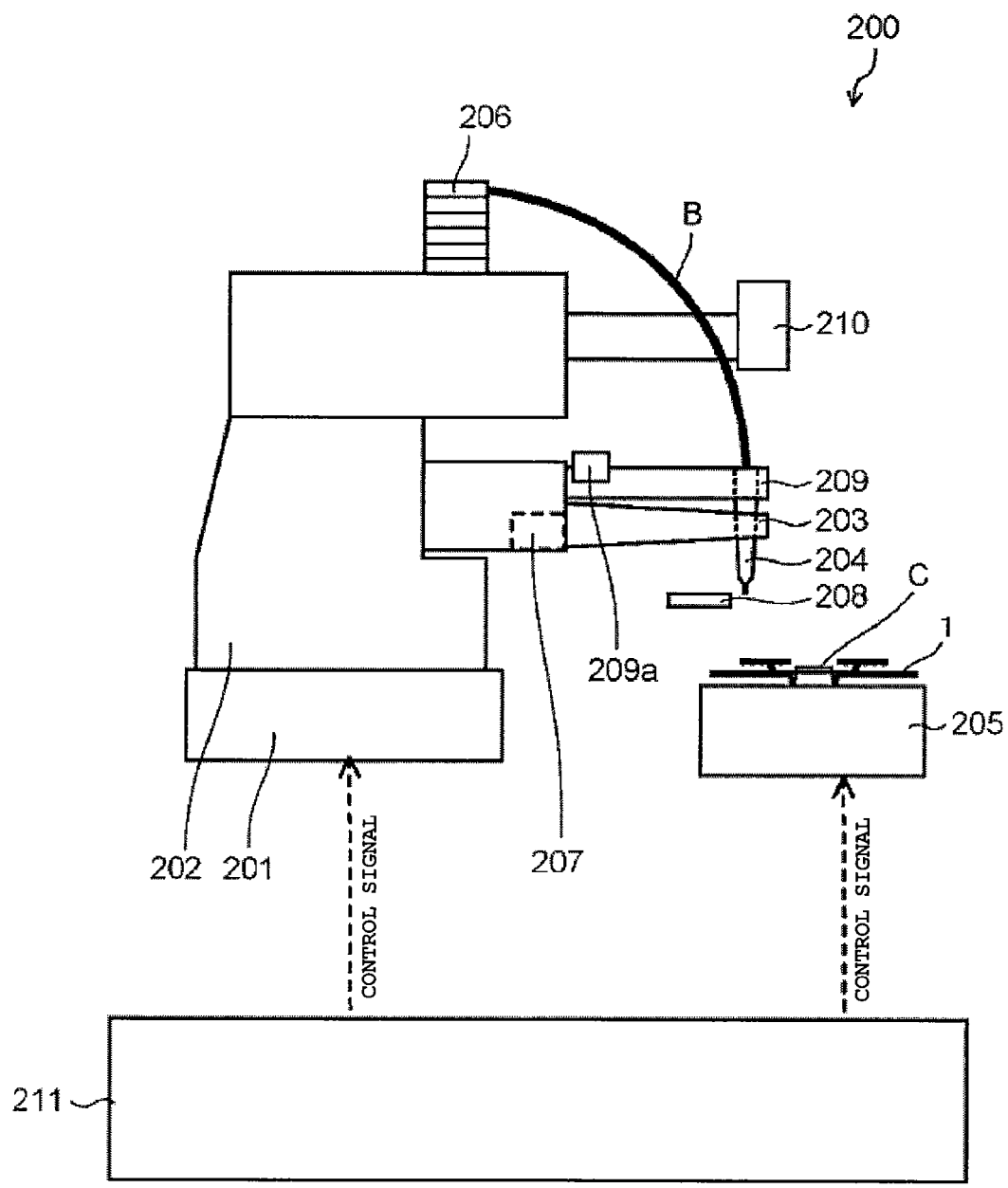
FIG. 4 is a constitutional diagram showing a wire bonding machine.

FIG. 4 is a constitutional diagram showing a wire bonding machine 200. The wire bonding machine 200 includes an X-Y stage 201, bonding head 202, bonding arm 203, capillary 204, bonding stage 205, spool 206, ultrasonic vibrator 207, spark rod 208, wire clamp 209, image pickup means 210, and control mechanism 211.

The bonding head 202 is installed on the X-Y stage 201, and the bonding arm 203 is mounted on the bonding head 202. The bonding arm 203 is driven around the rotation center by a Z-direction motor, so that its tip is contacted and separated in an arc shape to and from the pad surface of the semiconductor chips C as a bonding surface.

At the tip of the bonding arm 203, the capillary 204 is mounted. The X-Y stage 201 and the bonding head 202 constitute a moving mechanism, and the bonding head 202 can be freely moved in a plane (in an XY plane) along the bonding surface by the x-y stage 201. In addition, by driving the bonding arm 203 in the Z-direction, the tip of the bonding arm 203 and the capillary 204 mounted at the tip of the bonding arm 203 can be freely moved in X, Y, and Z directions. Here, at the tip of the bonding arm 203, the bonding stage 205 for fixedly securing the lead frame 1 is installed.

The capillary 204 is an open column having a tip with a conical shape. The bonding wire B can pass through the hole. The bonding wire B is supplied from the spool 206 mounted on the bonding head 202. The bonding arm 203 supplies ultrasonic energy to the capillary 204 by the ultrasonic vibrator 207. In addition, a spark rod 208 for heating the bonding wire extending from the tip of the capillary 204 into a ball shape is installed in the vicinity of the tip position of the capillary 204.

The wire clamp 209 for gripping and opening the bonding wire B, which is penetrated through the capillary 204, is installed in the bonding head 202. The wire clamp 209 is provided with an opening and closing mechanism 209a. The wire clamp 209 is opened and closed by the opening and closing mechanism 209a. In addition, the image pickup means 210 (for example, CMOS image sensor or CCD image sensor) for obtaining images of the semiconductor chips C, lead frame 1, etc. is mounted in the bonding head 202, and the XY direction of the capillary 204 is positioned based on the images picked up by the image pickup means 210. The control mechanism 211 controls the entire wire bonding machine 200.

The wire bonding machine is described as an example of the bonding machine using a bonding wire with a diameter of 10's of μm, however, in semiconductor devices in which radiation is considered important, an aluminum (Al) wire with a diameter of 100 s of μm is sometimes used as the bonding wire. In this case, using a tool called a bonding tool instead of the capillary 204 explained with reference to FIG. 4, may be used to join the pad of the semiconductor chip C and the inner leads 21a of the lead frame 1. In addition, the pad of the semiconductor chip C and the inner leads 21a of the lead frame 1 may also be joined by a metal plate such as copper.

(Resin Molding Machine 300)

Figure 5:
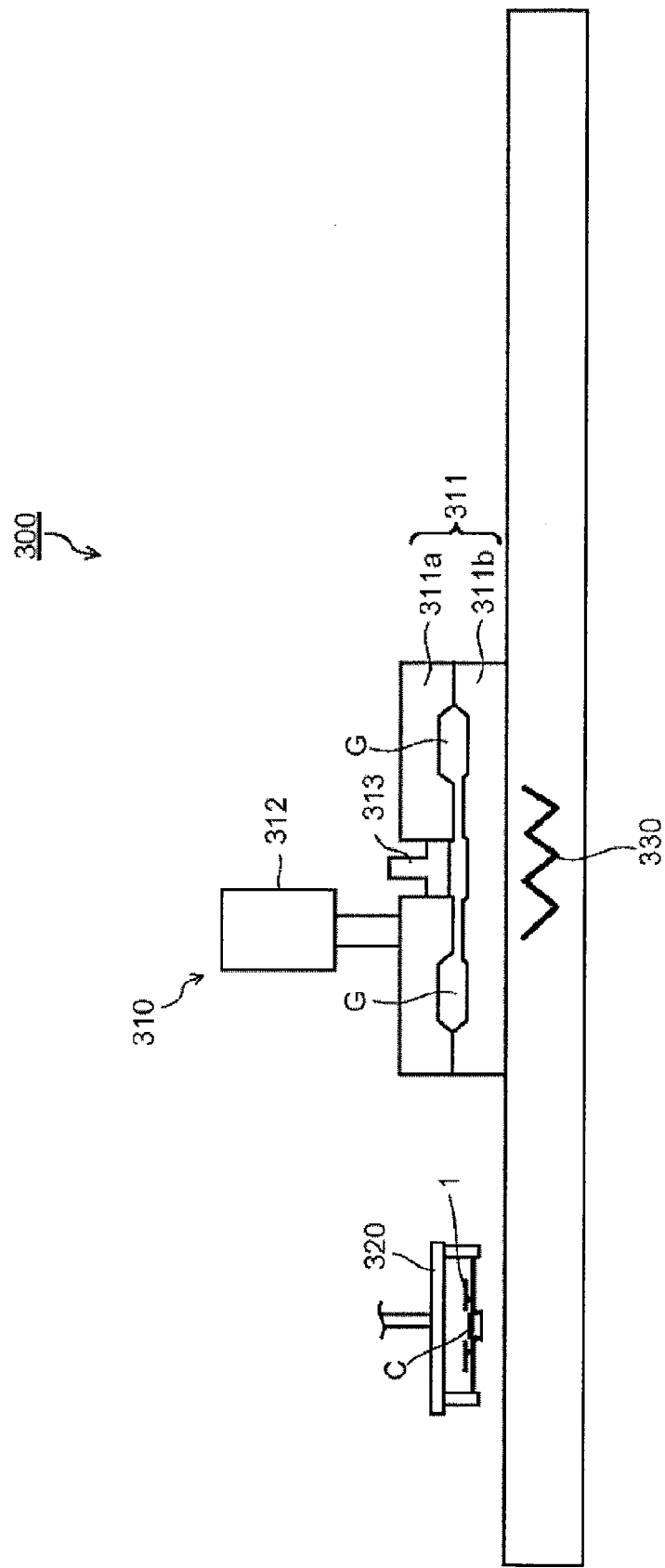
FIG. 5 is a constitutional diagram showing a resin molding machine.

FIG. 5 is a constitutional diagram showing a resin molding machine 300. The resin molding machine 300 is provided with a molding mechanism 310 for molding the lead frame 1, on which the semiconductor chip C has been mounted, with a resin, a conveying mechanism 320 for conveying the lead frame 1, on which the semiconductor chip C has been mounted, to and from a designated position of the molding mechanism 310, and a heating mechanism 330 for heating the molding mechanism 310 to a designated temperature (for example, 160-180° C.). The heating mechanism 330 can be, for example, an electrothermal wire (resistance heater).

The molding mechanism 310 includes a mold 311, driving mechanism 312, and plunger 313 for extruding a melted resin. The mold 311 includes an upper mold 311a and a lower mold 311b. In the upper mold 311a and the lower mold 311b, cavities (spaces) G fitted to the shape of a resin package are respectively formed. The driving mechanism 312 vertically drives the upper mold 311a. The plunger 313 extrudes a melted resin tablet into, the cavities G of the mold 311. In the embodiment shown in FIG. 5, the molding machine is configured to overmold the resin on a pair of adjacent lead frames 1, such as the pair thereof as shown in FIG. 1 and in FIG. 6.

(Manufacture of Semiconductor Package)

Next, the manufacture of a semiconductor package using the lead frame 1 of the embodiment will be explained with reference to FIGS. 1 to 5.

(Die Bonding Process)

First, a desired semiconductor chip C is picked up from a wafer, on which plural semiconductor chips have been formed, by the collet 150 and placed on the mounting surface 11 of the die pad 10 of the lead frame 1. On the mounting surface 11 of the die pad 10, for example, a thermosetting resin or metal paste (silver paste, etc.) is spread. After the semiconductor chip C is mounted on the mounting surface 11 of the die pad 10, the semiconductor chip C is heated and thereby fixed onto the mounting surface 11 of the die pad 10. According to an embodiment, the semiconductor chip C is mounted with its face, i.e., device side, up on the mounting surface 11 of the die pad 10.

(Wire Bonding Process)

First, the tip of the bonding wire B inserted into the capillary 204 is sparked by the spark rod 208 to process the tip of the bonding wire B into a ball shape. Next, the capillary 204 descends onto the electrode of the semiconductor chip C. In a state in which the ball formed at the tip of the bonding wire B is pushed and contacted to the electrode of the semiconductor chip C, ultrasonic waves are applied from the ultrasonic vibrator 207, joining the tip of the bonding wire B with the electrode of the semiconductor chip C.

Next, the capillary 204 moves to the inner lead 21a of the lead frame 1 up onto the end T while drawing an appropriate track. The capillary 204 then descends to the end T of the inner lead 21a. In a state in which the tip of the bonding wire B is pushed and contacted to the end T of the inner lead 21a, ultrasonic waves are applied by the ultrasonic vibrator 207, so that the tip of the bonding wire B is wedge-joined with the tip T of the inner lead 21a. After the bonding wire B is joined with the end T of the inner lead 21a, the wire lamp 209 sandwiches the bonding wire B and pulls the wire up, cutting the bonding wire B.

Similarly, the remaining inner leads 21a and the electrodes of the semiconductor chip C are joined by the bonding wires B. Here, as mentioned above, using a tool called a bonding tool, the pads of the semiconductor chip C and the inner leads 21a of the lead frame 1 may also be joined by an aluminum (Al) wire with a diameter of 100 s of μm. In addition, the pads of the semiconductor chip C and the inner leads 21a of the lead frame 1 may also be joined by a metal plate such as copper.

(Resin Molding Process)

The heating mechanism 330 heats the mold 311 of the molding mechanism 310 to a designated temperature (for example, 160 to 180° C.) in advance. The lead frame 1, on which the semiconductor chip C has been mounted, is set at a designated position of the molding mechanism 310 by the conveying mechanism 320. The molding mechanism 310 descends the upper mold 311a by the driving mechanism 312 and sandwiches the lead frame 1 by the upper mold 311a and the lower mold 311b.

Next, a resin tablet (for example, thermosetting epoxy resin) is supplied from a tablet supply mechanism not shown in the figure, and after the resin tablet is melted, the melted resin is extruded into the cavities G of the mold 311 by the plunger 313. Next, the resin is cured, the upper mold 311a is lifted by the driving mechanism 312, and the lead frame 1 molded with the resin is conveyed out by the conveying mechanism 320.

(Cutting-Off Process)

After the resin molding, the tie bars 22 for connecting each lead 21 are cut. Next, while folding the tips of the leads (outer leads 21b) into a desired shape, the lead frame 1 is cut at the position indicated with the alternate long and short dashed line of FIG. 2A. The lead frame 1 is then cut at the position indicated with the solid line in FIG. 2A, that is, the second web 31 and the manufactured semiconductor package is separated from the frame body 40.

After the resin molding, burrs of the semiconductor package are preferably removed. In addition, in the part protruding from the resin of the semiconductor package, that is, the outer leads 21b, a metal film such as solder material] or tin is preferably formed by plating.

As mentioned above, the lead frame 1 of the embodiment includes a die pad 10, a frame body 40, lead groups 20 arranged above U-shaped members and opposite to each other via the die pad 10, and a connecting member 30 for connecting the die pad 10 and the lead groups 20 to the frame body 40. For this reason, it is unnecessary to connect the frame and separate material in which the leads have been formed. As a result, it is unnecessary to establish a clearance between the hole and the pin used to align and adhere the parts of the lead frame together thus enabling an improvement in the positional tolerance among connected portions of the lead frame 1.

In addition, the lead frame 1 of the embodiment has the first web 32a, which positions the ends T of the inner leads 21a of the lead group 20 above the mounting surface 11 of the die pad 10, and a cantilever 32 for connecting the lead group 20 to the frame body 40. By positioning the ends T of the inner leads 21a of the lead group 20 above the mounting surface 11 of the die pad 10 through the first web 32a, dead space (gap) in the horizontal direction of the mounting surface 11 of the die pad 10 and the ends T of the inner leads 21a can be eliminated. Accordingly, the semiconductor package can be miniaturized.

Moreover, the lead frame 1 and the tie bars 22 of the lead group 20 are connected by the connecting member 30 having the first web 32a to fix the lead group 20 to the frame body 40. For this reason, the positions of the lead groups 20 arranged opposite to each other via the die pad 10 can be positioned independently of, yet with precision with respect to, the die pad 10.

In the lead frame 1 shown in FIGS. 1, 2A, and 2B of the lead groups that are arranged opposite to each other via the die pad 10, the ends T of the inner leads of the leads 21 of one lead group 20 are in an interconnected shape, and the ends T of the leads 21 of the other lead group 20 are in an independent shape, that is, a non-interconnected shape. However, the shape of the ends T of the leads 21 shown in FIGS. 1, 2A, and 2B is an example, and the shape of the ends T of the leads 21 depends upon the kinds of semiconductor chips that are mounted on the mounting surface 11 of the die pad 10.

For example, all of the ends T of the leads 21 of two lead groups 20, which are arranged at opposite positions via the die pad 10, may also be in an independent shape, that is, a non-interconnected shape, and only part of the ends T of the leads 21 may also be in a connected shape (for example, a shape in which two adjacent ends are connected or a shape in which only four ends of both sides are connected).

Modified Example of the Embodiment

Figure 6:
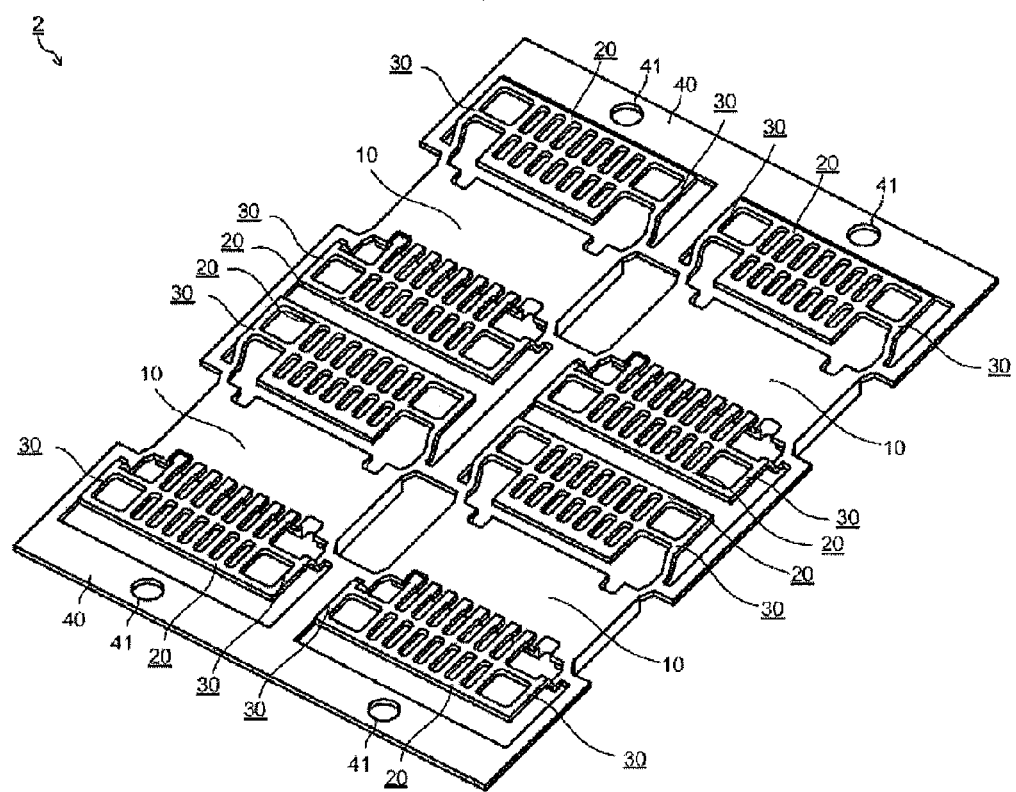
FIG. 6 is a constitutional diagram showing the lead frame of a modified example of an embodiment.

FIG. 6 is a constitutional diagram (bird's-eye view) showing a lead frame 2 of a modified example of the embodiment.

For example, as shown in FIG. 6, the constitution of four elements (semiconductor chips) may also be prepared in one frame body 40. With the increase of semiconductor chips that may be positions in one frame body 40, the number of semiconductor packages formable at a time can be increased. As a result, the productivity of semiconductor packages can be improved. The other effects are similar as those of lead frame 1 as previously described. An actual lead frame may have about 10 elements (semiconductor chips) horizontally connected as a whole.

Other Embodiments

While certain embodiments have been described, these embodiments have been presented by way of example only, and are not intended to limit the scope of the inventions. The novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in FIGS. 1, 2A, 2B, and 6, the first web 32a of the lead frames 1 and 2 are actually bent, and the ends T of the inner leads 21a of the lead groups 20 are positioned in the upper part of the mounting surface 11 of the die pad 10. However, a state in which the first web 32a of the lead frames 1 and 2 are not bent, that is, a state in which the first web 32a of the lead frames 1 and 2 extends straight is also included. With the adoption of the state in which the first web 32a of the lead frames 1 and 2 are extended straight, since the lead frames 1 and 2 have a flat shape, the space that is occupied by the lead frames 1 and 2 can be reduced during the conveyance (for example, product delivery, etc.) of the lead frames 1 and 2, thus being able to convey more lead frames 1 and 2 by a container with the same volume. In addition, the deformation of the lead part can also be prevented.

What is claimed is:

1. A lead frame configured from a single piece of material comprising:
    a first U-shaped member with two arms and a base;
    a die pad having a first side attached to the first U-shaped member adjacent to ends of the arms of the first U-shaped member;
    a first lead group disposed in an overlying position between the first side of the die pad and an interior perimeter of the first U-shaped member;
    two first webs, each first web extending from the end of one of the arms of the first U-shaped member to the first lead group to support the first lead group above the die pad; and
    two second webs, each second web interconnecting the end of one of the arms of the first U-shaped member to the die pad.

2. The lead frame of claim 1, further comprising:
    a second U-shaped member with two arms and a base, wherein the second U-shaped member is located opposed to and interconnected with a second side of the die pad, the second located on an opposite side of the die pad from the first side.

3. The lead frame of claim 2, further comprising:
    a second lead group disposed in an overlying position between the second side of the die pad and an interior perimeter of the second U-shaped member; and
    two additional first webs, each additional first web extending from an end of one of the arms of the second U-shaped member to the second lead group to support the second lead group above the die pad.

4. The lead frame of claim 1, wherein the two first webs extend outwardly away from the die pad from the ends of the arms of the first U-shaped member.

5. The lead frame of claim 1, wherein the two second webs extend inwardly towards the die pad from the end of the arms of the first U-shaped member.

6. The lead frame of claim 1, further comprising:
a cantilever portion extending from each first web towards the base of the first U-shaped member.

7. The lead frame of claim 1, wherein the first lead group includes a preform lead portion.

8. The lead frame of claim 7, wherein the preform lead portion includes a tie bar which extends substantially across the first lead group in a direction substantially spanning a gap between the opposed arms of the first U-shaped member.

9. The lead frame of claim 1, wherein the first lead group includes a plurality of leads extending in a direction generally from the base of the first U-shaped member to a position generally adjacent to and spaced from the first side of the die pad.

10. The lead frame of claim 1, further comprising:
at least one standoff extending from opposed ends of the die pad and substantially spanning a gap between the opposed arms of the first U-shaped member and further extending in a direction opposite to a direction that the first lead group extends from the die pad.

11. The lead frame of claim 3, further comprising:
an encapsulating member overlying at least the die pad and portions of the first and second lead groups, the encapsulating member extending between the first webs of the first U-shaped member and the additional first webs of the second U-shaped member.

12. The lead frame of claim 1, wherein the first lead group is disposed in a plane different than a plane of the die pad or first U-shaped member.

13. The lead frame of claim 1, wherein the die pad is disposed in a same plane as the first U-shaped member.

14. A semiconductor package, comprising:
a lead frame configured from a unitary piece of material, comprising:
a first U-shaped member with two arms and a base;
a die pad having a first side attached to the first U-shaped member adjacent to ends of the arms of the first U-shaped member;
a first lead group disposed in an overlying position between the die pad and an interior perimeter of the first U-shaped member;
two first webs, each first web extending from an end of one of the arms of the first U-shaped member to the first lead group to support the first lead group above the die pad;
two second webs, each second web interconnecting the end of one of the arms of member to the die pad;
a semiconductor chip having opposed sides wherein the opposed sides extend generally orthogonal in direction with respect to the arms of the first U-shaped member; and
at least one wire extending from a bond pad on the semiconductor chip to a lead in the first lead group.

15. The lead frame of claim 14, wherein the first lead group includes a plurality of individual leads extending generally parallel to a direction of the opposed arms of the U-shaped member.

16. The lead frame of claim 15, wherein at least some of the plurality of the individual leads include an enlarged end positioned adjacent one of the opposed sides of the semiconductor chip.

17. The lead frame of claim 16, wherein the semiconductor chip, and the enlarged ends of the plurality of individual leads are encapsulated in a resin.

18. The lead frame of claim 14, wherein the die pad and the first U-shaped member are disposed in a same plane.

* * * * *